Figure 1:
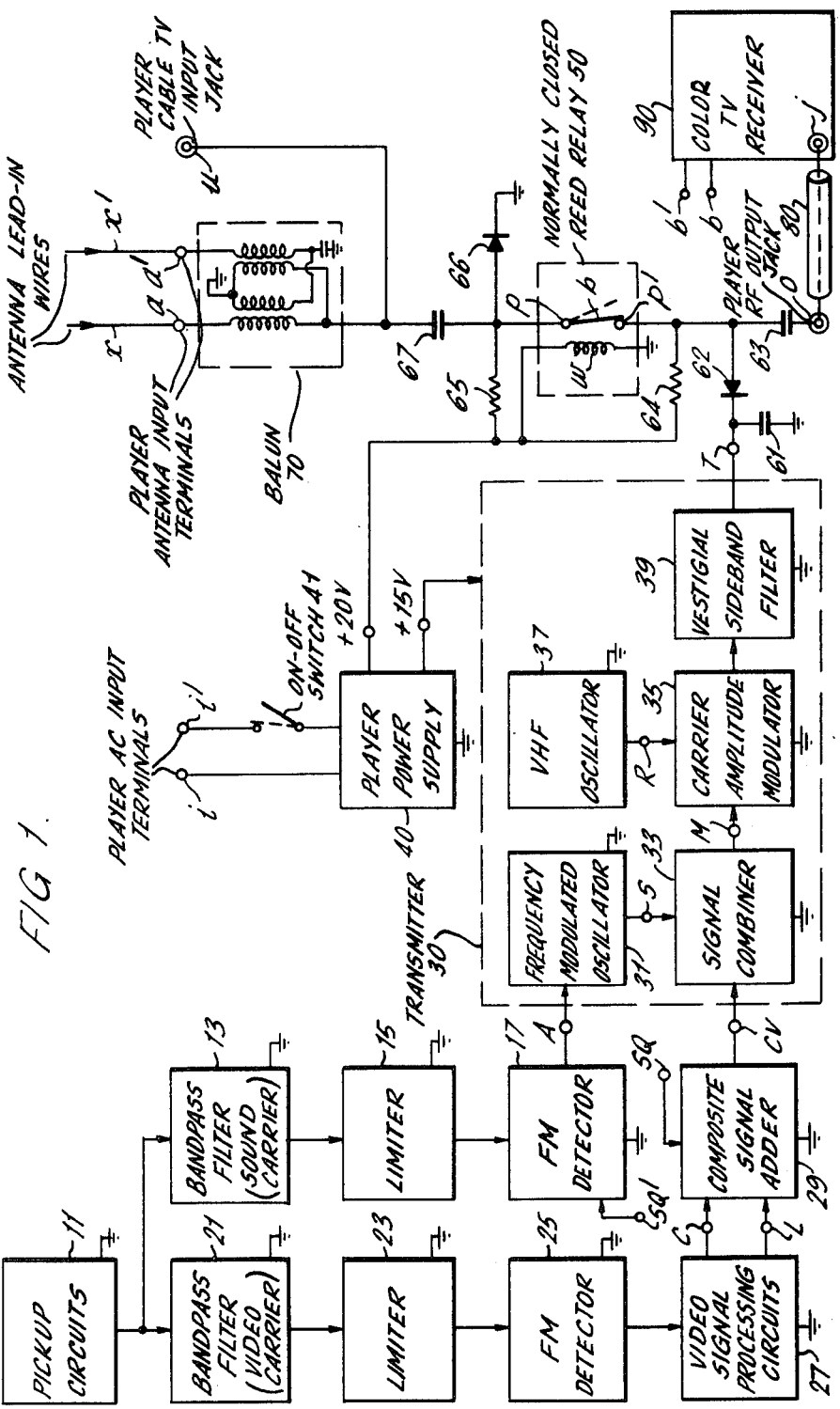

United States Patent [19]

Yu

[11] 4,097,899
[45] Jun. 27, 1978

[54] VIDEO RECORD PLAYER SWITCHING SYSTEM

[75] Inventor: John Pang Yu, Indianapolis, Ind.

[73] Assignee: RCA Corporation, New York, N.Y.

[21] Appl. No.: 747,866

[22] Filed: Dec. 6, 1976

[30] Foreign Application Priority Data

Dec. 8, 1975 United Kingdom ............... 50280/75

[51] Int. Cl.$^2$ ........................ H04N 5/22; H04N 7/00; H04N 5/78; H04N 5/44
[52] U.S. Cl. .................................... 358/181; 358/83; 360/33; 358/188
[58] Field of Search ..................... 358/4, 83, 181, 188; 360/33

[56] References Cited

U.S. PATENT DOCUMENTS

| | | | |
|---|---|---|---|
| 3,484,548 | 12/1969 | Kowal et al. ......................... | 358/181 |
| 3,573,350 | 4/1971 | Rhee ................... | 360/33 X |
| 3,795,762 | 3/1974 | Willis ................... | 358/83 X |
| 3,824,335 | 7/1974 | Hart ....................... | 360/33 |
| 3,829,891 | 8/1974 | Uchida ............... | 358/83 X |
| 4,031,548 | 6/1977 | Kato et al. .......................... | 360/33 X |

*Primary Examiner*—Robert L. Griffin
*Assistant Examiner*—Aristotelis M. Psitos
*Attorney, Agent, or Firm*—Eugene M. Whitacre; William H. Meagher

[57] ABSTRACT

Video record player has RF output terminal linked to antenna terminals of a television receiver, and an RF input terminal coupled to antenna lead-in. Player's processing circuits provide respective sound signal and composite video signal outputs during record playback. First oscillator, operating at intercarrier sound frequency (e.g., 4.5 MHz), is subject to frequency modulation by player's sound signal output (when present). Sum of oscillator output and player's composite video signal output (when present) forms modulating signal for an amplitude modulator, which receives carrier waves from second oscillator, operating at selected broadcast picture carrier frequency. A first diode is coupled between modulator output terminal and player's RF output terminal, while second diode is coupled between player's RF input terminal and reference potential point. Normally closed relay provides a conductive path between player's RF input and output terminals when closed. Forward biasing voltages for diodes, and energizing potential for relay's control winding (as well as operating potentials for oscillators) are provided by player's power supply when player is switched on, so that carrier waves from player are supplied to receiver while antenna lead-in is isolated. When player is switched off, antenna lead-in is automatically linked to receiver's antenna terminals.

18 Claims, 2 Drawing Figures

VIDEO RECORD PLAYER SWITCHING SYSTEM

The present invention relates generally to video record player systems, and particularly to novel apparatus facilitating convenient interconnections between a video record player other video information sources, and a television receiver.

In apparatus for playback of a recording of picture-representative video signals, it is often convenient to provide the player output in a modulated carrier format suitable for application to the antenna input terminals of a television receiver, whereby the latter instrument may serve without internal modification to reproduce the recorded picture information. An illustrative example of such a player system is the video disc playback apparatus described in U.S. Pat. No. 3,842,194, issued to Jon K. Clemens. One example of simplified transmitter circuitry, which may be employed to place the recovered video signals (and a sound accompaniment) in suitable modulated carrier form for antenna terminal application, is illustrated in U.S. Pat. No. 3,775,555, issued to David J. Carlson.

In accordance with the principles of the present invention, a video record player is provided with novel switching apparatus which permit player association with a television receiver in a manner providing a convenient facility for switching the receiver between a recorded signal responding mode and its normal broadcast signal responding mode (or cable distributed signal responding mode). Pursuant to an illustrative embodiment of the present invention, the video record player is provided with an RF input for coupling to an external signal source (e.g., broadcast receiving antenna), a player output terminal for coupling to the receiver's RF input, and a switching system which provides a first low impedance signal path therebetween in absence of energization of the player's power supply. The switching system responds to energization of the player's power supply by disrupting the aforesaid signal path, while completing a second low impedance signal path between the output of the player's transmitter circuitry and the player output terminal.

In a preferred form, the aforesaid switching system, includes a normally closed relay and a pair of diodes. In the absence of player power supply energization, the normally closed relay completes the first signal path, while a nonconducting state for one diode, serving as a series element in the second signal path, opens the latter path. Also, a nonconducting state for the second diode, coupled between the player's RF input and a point of reference potential, precludes shunting of signals away from the first signal path. By provision of suitable connections between the player's power supply and the diodes and the relay's control winding, energization of the player's power supply effects an opening of the relay and conduction by the diodes. Under these circumstances, the second signal path is completed by the first conducting diode, while the first signal path is disrupted by the relay opening (and bypassed by the second conducting diode). The combination of the open relay and second conducting diode assure a high order of isolation of the player's RF input from the player's transmitter circuitry (e.g., providing transmitter output attenuation of the order of 65 db.).

In accordance with a further aspect of the present invention the player's transmitter circuitry is desirably associated with the switching system in such a manner that whenever the recorded signal responding mode is established, carrier signals are delivered to the television receiver to ensure quieting of the receiver's sound channel when necessary. Such a result is effected by associating carrier production by the transmitter circuitry with the power supply energization that effects switching into the recorded signal responding mode.

Pursuant to an additional aspect of the present invention, the transmitter circuitry parameters are desirably chosen in a manner establishing a relatively high (e.g., 7:1) ratio between picture and sound carrier levels, whereby sound-color beat interference at objectionable levels may be avoided in the television receiver operation, while avoiding the expense and complexity of crystal control in the transmitter circuitry. In accordance with a preferred form of the transmitter circuitry, achievement of a high percentage of modulation of the amplitude of the picture carrier is aided by association of a balancing resistance network with a modulator transformer.

Figure 2:
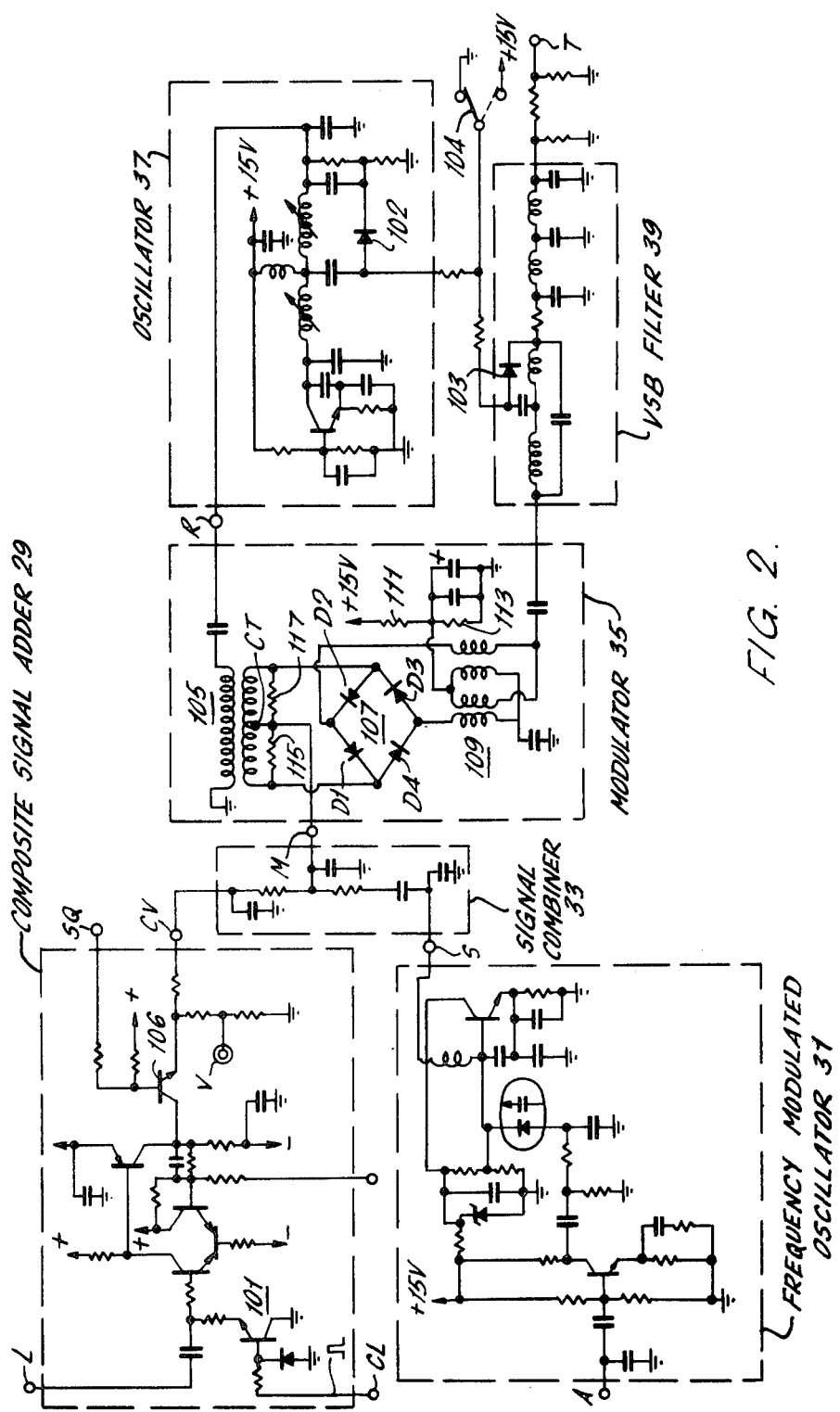

In the accompanying drawings:

FIG. 1 illustrates, partially schematically and partially by block diagram representation, a video record player system embodying principles of the present invention; and FIG. 2 illustrates schematically circuit arrangements which may be advantageously employed in transmitter apparatus and associated circuitry of the FIG. 1 system.

FIG. 1 illustrates applicaton of the principles of the present invention to playback apparatus, which is illustratively of the video disc player type described in U.S. Pat. No. 3,911,476, issued to Eugene O. Keizer. In the FIG. 1 arrangement, pickup circuits 11 serve to recover from a video disc during playback recorded information in the form of (1) a picture carrier wave subject to frequency modulation in accordance with composite color video signals inclusive of correlated luminance and chrominance signal components, and (2) an accompanying sound carrier wave subject to frequency modulation in accordance with audio signals.

A first bandpass filter 13, coupled to the output of pickup circuits 11, selectively passes the sound carrier waves and sidebands thereof, via a limiter 15, to the input of a first FM detector 17. Detector 17 provides sound carrier demodulation to develop the recorded audio signals at its output terminal A. A second bandpass filter 21, also coupled to the output of pickup circuits 11, selectively passes the picture carrier waves and sidebands thereof, via a limiter 23, to the input of a second FM detector 25. Detector 25 provides picture carrier demodulation to develop recorded composite color video signal at its output, which is applied to video signal processing circuits 27. Where, as disclosed, for example, in the aforesaid Keizer patent, the recorded format of the composite color video signals differs from that required by the associated color television receiver, the processing circuits 27 serve to convert the recovered signals to a format compatible with the latter requirements. The processing circuits 27 provide respective luminance and chrominance signal component outputs at output terminals L and C, respectively. These outputs are summed in composite signal adder 29 to form a composite color video output signal at its output terminal CV.

The FIG. 1 player apparatus further includes a transmitter 30, responding to the respective recorded signal outputs appearing at terminals A and CV. Included in transmitter 30 is a frequency modulated oscillator 31 receiving a modulating signal input from terminal A. The nominal operating frequency of oscillator 31, in the absence of a modulating signal, is chosen to match the "intercarrier" frequency (picture-sound carrier difference) of the television system for which the associated receiver is designed. Illustratively, such frequency choice is 4.5 MHz., and the carrier wave output of oscillator 31 is deviated therefrom in accordance with the audio signal output of detector 17, when the latter signal is present.

The output of oscillator 31 is combined with the composite color video signal output of adder 29 in signal combiner 33 to develop a modulating signal, for delivery to the modulating signal input terminal M of a carrier amplitude modulator 35. The RF input terminal R of modulator 35 receives the output of VHF oscillator 37. The operating frequency of oscillator 37 is chosen to match a selected one of the picture carrier wave frequencies to which the associated television receiver is responsive. The modulated carrier wave output of modulator 35 is supplied via a vestigial sideband filter 39 (designed to pass the selected carrier wave, one of its sidebands, and a small portion of the remaining sideband) to the transmitter output terminal T.

Pursuant to the approach of the present invention, the FIG. 1 player additionally includes a switching system now to be described. The transmitter output terminal T is connected to the cathode of a switching diode 62 (e.g., of the PIN type), the anode of which is coupled via capacitor 63 to the player's RF output jack 0. A capacitor 61 is coupled between the diode cathode and a point of reference potential (e.g., player chassis ground).

The anode of diode 62 is also connected to a terminal $p'$ of a normally closed reed relay 50. In the absence of current flow in the relay's control winding "w", switch blade "b" provides a conductive connection between terminal p' and a second terminal "p" of the relay 50. Terminal "p" is connected to the anode of a second switching diode 66 (similar in type to diode 62), the cathode of which is connected to the aforesaid reference potential point. Terminal "p" is also coupled via a capacitor 67 to (1) the (unbalanced) output terminal of a balun 70 having its (balanced) input terminals connected to a pair of antenna input terminals a, a' provided on the player housing exterior, and (2) a cable input jack "u", also provided on the player housing exterior.

The FIG. 1 player also includes a power supply 40 responding to alternating current energy applied to the player's AC input terminals (i, i') when the player's on-off switch 41 is placed in the "on" condition. Power supply 40 has a plurality of DC supply potential output terminals, for supplying energizing potentials to various elements of the player apparatus. Only two of the supply output terminals are illustrated in the simplified showing of FIG. 1, with one (+15V.) providing the energizing potential input for transmitter 30, when switch 41 is in the "on" (dashed line) condition. Another supply output terminal (+20V.) is linked by resistor 65 to the anode of diode 66, and by resistor 64 to the anode of diode 62. Relay control winding "w" is connected between the +20V. terminal and the aforesaid reference potential point.

When the player's on-off switch is in the "on" condition, the following results ensue: (1) transmitter 30 is rendered operative; (2) diodes 66 and 62 are rendered conducting; and (3) relay 50 opens (eliminating the conductive connection between terminals p' and p). The consequences are that (a) the transmitter output signal at terminal T is coupled to output jack 0 with little attenuation; and (b) signals from the antenna input terminals a, a' (or from input jack "u") are effectively barred from delivery to output jack 0 by virtue of the extremely low impedance shunt path formed by conducting PIN diode 66, and the signal divider it forms with series capacitor 67, and by virtue of the high series impedance established by the opening of relay 50. Moreover, the high series impedance of the open relay 50 and the low shunt impedance of the conducting diode 66 assure provision of a high degree of isolation (of the order of 65 db) between the operating transmitter's output terminal T and the antenna terminals a, a', whereby significant radiation of the transmitter output is substantially precluded.

When the player's on-off switch 11 is in the "off" condition, (1) transmitter 30 is inoperative, (2) diodes 62 and 66 are non-conducting, and (3) relay 50 is closed. The consequences are that the antenna input terminals a, a' (and input jack "u") are linked to the player's output jack by a path providing little attenuation (e.g., of the order of one db, or less) at typical broadcast carrier frequencies, while the signal path between the output terminal T of the inoperative transmitter 30 and the output jack 0 is disrupted.

In view of the nature of the switching system operation described above, it is thus contemplated that the receiver's normal RF input source should be coupled to the appropriate one of the player's inputs. Illustratively, as shown in FIG. 1 such coupling may comprise coupling balanced antenna lead-in wires x, x' to the player's antenna input terminals a, a'. Additionally, a coupling is established between the player's RF output jack 0 and an appropriate RF input of the receiver to be used for reproduction purposes. Where the receiver to be used is, as shown in FIG. 1, a color television receiver 90 of a type incorporating (e.g., for cable TV input purposes) an RF input jack "j", the coupling may simply comprise a suitable shielded cable 80 linking jacks 0 and "j". Where the receiver to be used lacks such an input, the output of cable 80 may be applied via a suitable balun-type coupler to the balanced input terminals (b, b') of the receiver.

When the aforesaid couplings are provided, one is assured that the receiver is automatically coupled to its normal RF input source whenever the player is off. Moreover, by simply turning the player on, one is assured that such normal coupling is automatically disrupted, and the receiver is automatically rendered responsive to the player output. Additionally, one is assured that whenever the antenna coupling disruption is effected, picture and sound carriers are automatically supplied to the receiver's input. The development of annoying noise by the receiver's sound channel during non-playback periods is precluded by the quieting effect of the presence of the carriers.

At various times in the course of record playback operations (e.g., during change of records, during search for a desired segment of a given record, etc.) there will be an absence of usable picture and sound signals from the output of pickup circuits 11. Under these circumstances, it is desirable that the player include suitable squelch circuitry for barring delivery of noise to terminals A and CV at the input of transmitter 30. Illustratively, squelch circuitry of the type described in U.S. Patent Application Ser. No. 590,484, of A.

Baker, now U.S. Pat. No. 4,017,677, may be employed for delivery of an appropriate squelch signal to a squelch input terminal SQ of adder 29 (and to a squelch input terminal SQ' of detector 17) to bar such noise delivery. The output at terminal T will comprise, in this case, a picture carrier and an unmodulated sound carrier which will assure quieting of the receiver's sound channel.

FIG. 2 illustrates schematically a desirable arrangement for implementing the functions of adder 29, oscillator 31, combiner 33, modulator 35, oscillator 37 and filter 39 of FIG. 1 system. The adder 29 includes a clamping circuit 101, responsive to clamping pulses delivered at terminal Cl, to provide restoration of the DC component of the recorded luminance signal.

A switching arrangement, including switch 104 and switching diodes 102, 103, is associated with oscillator 37 and filter 39 to permit a choice in picture carrier frequency, as described in the aforesaid Carlson patent.

For circuit simplification and cost reduction purposes, oscillator 31 is not crystal controlled. While drift of the oscillator frequency may result in departure of a sound-color beat frequency from its normally expected interlace character, the beat visibility problem is desirably solved in a different manner: viz., reduction in sound carrier amplitude to provide a higher effective picture carrier-sound carrier ratio than is standard for broadcast signals. Illustratively, the output levels for the oscllators 31, 37 are established so that the sound carrier level in the transmitter output at terminal T is approximately 17 db less than the peak picture carrier level. With such a level relationship (approximately 1:7), a frequency drift of ± 5 KHz for the resting frequency of oscillator 31 may be accepted, without encountering annoying effects in the viewed image due to visibility of beats between the sound carrier and color subcarrier components of the signal processed by the television receiver. Sound carrier level reduction beyond a 1:10 ratio, however, is not believed desirable, because of noticeably adverse effects on the signal-to-noise ratio of the receiver's sound output.

Modulator 35 is shown in FIG. 2 to be of a ring modulator form, employing a diode bridge 107, consisting of four diodes (D1, D2, D3, and D4) disposed in a ring configuration. The ring input terminals (at the D1, D4 and D2, D3 junctions) are connected to the end terminals of the secondary winding of an input transformer 105, while the ring output terminals (at the D1, D2 and D3, D4 junctions) are connected to the input terminals of a balun-type output transformer 109. Picture carrier waves from terminal R are applied to the primary winding of input transformer 105, while the modulating signal from terminal M is applied to the center-tap CT of the secondary winding of the input transformer 105. A bias voltage, supplied by a voltage divider formed by resistors 111, 113 is applied via the output transformer winding to the diode ring to unbalance the ring modulator (supplying forward bias to diodes D1 and D3, and reverse bias to diodes D2 and D4). The voltage divider output amplitude and polarity are selected so that: (a) when the clamped video signal delivered by emitter followed 106 to the adder output terminal M is at the sync tip level, picture carrier waves pass to the modulator output at the desired peak picture carrier level; and (b) when the clamped video signal delivered to terminal M is at peak white level, the picture carrier level at the modulator output is reduced as appropriate amount (e.g., to a level corresponding to 12.5% of the peak carrier level).

With accurate matching of the diodes of the ring 107, accurate location of center-tap CT, and accurate matching of the windings of output transformer 109, a predetermined voltage level at terminal CV will be associated with 100% modulation of the picture carrier (i.e., balanced cancellation of carrier output). However, with practical parts tolerances for mass manufacture, such a result is not readily assurable, wherefor attainment of a predetermined high percentage modulation (e.g., 87.5%) upon peak white level appearances at the adder output is difficult to ensure. To overcome this problem, modulator 35 includes an additional balancing network, formed by a pair of resistors 115 and 117 of substantially matching resistance value. Resistor 115 is connected between terminal M and one end terminal of the input transformer secondary winding, while resistor 117 is connected between terminal M and the other end terminal of the input transformer secondary winding. The presence of balancing resistors 115, 117 reduces the unbalancing effects of diode mismatching and transformer winding mismatching to a degree providing reasonable assurance that the desired high percentage modulation will be obtained upon peak white level appearance at the adder output. For even greater precision of modulator balancing, the resistance network 115, 117 may be replaced with a potentiometer, having end terminals connected to the secondary winding end terminals and an adjustable tap connected to terminals M and CT.

It may be noted that when the reed relay 50 (FIG. 1) is in its closed condition, the conductive path between terminals $p$, $p'$ will exhibit some inductive impedance at the RF frequency of the signals being passed to output jack O. However, the closed condition of the relay 50 is accompanied by a nonconducting condition for diodes 62, and 66; the nonconducting diodes appear as shunt capacitive impedances at the respective ends of the relay's conductive path ($p$-$p'$). A pi network is thus formed by these elements, which exhibits a lowpass filter characteristic. With suitable element choices, the cut-off frequency for the lowpass filter thus formed may be shited (e.g., to 300 Mhz) above the range of carrier frequencies to be passed, so that signals may be readily passed from the player's RF input to th player's RF output with relatively little attenuation (e.g., 1 db or less).

It may further be noted that the aforementioned use of a reduced sound carrier level, relative to that employed for broadcast purposes, lessens the likelihood that sound carrier addition to the composite video signal (at terminal M) during high brightness scene portions will result in undesirable picture carrier overmodulation effects.

What is claimed is:

1. In a video record player, including means for recovering recorded signals respectively representative of picture information and accompanying sound information; apparatus comprising, in combination:
   an external signal input terminal;
   a player output terminal;
   a player on/off switch, subject to switching between "on" and "off" conditions;
   a power supply developing a plurality of supply potentials in response to switching of said player on/off switch to said "on" condition;

means, rendered operative in response to supply potential development by said power supply, for forming a player output signal inclusive of picture carrier frequency oscillations and sound carrier frequency oscillations;

said player output signal forming means having a picture signal input terminal coupled to said recorded signal recovering means and a sound signal input terminal coupled to said recorded signal recovering means, and including means for modulating the amplitude of said picture carrier frequency oscillations in accordance with recovered picture signal information when present at said picture signal input terminal, and means for modulating the frequency of said sound carrier frequency oscillations in accordance with recovered sound signal information when present at said sound signal input terminal; and a switching system coupled to said power supply, and subject to operation in a first mode in response to development of one of said supply potentials, while subject to operation in a second mode in the absence of said one supply potential development; said switching system, when operating in said first mode, providing a first, low impedance, signal path for coupling said player output signal to said player output terminal, while isolating said external signal input terminal from said player output terminal and said output signal forming means; said switching system, when operating in said second mode, providing a second, low impedance, signal path for coupling said external signal input terminal to said player output terminal, while isolating said output signal forming means from said player output terminal and said external signal input terminal.

2. Apparatus in accordance with claim 1, wherein said switching system includes a first diode rendered conducting in response to said one supply potential development and nonconducting in the absence of said one supply potential development, and wherein said first diode completes said first signal path when rendered conducting.

3. Apparatus in accordance with claim 2, wherein said switching system includes:
a second diode coupled between said external signal input terminal and a point of reference potential; and
means for rendering said second diode conducting in response to said one supply potential development.

4. Apparatus in accordance with claim 3, wherein said switching system includes:
a relay having a pair of signal terminals and a control winding, and providing a conductive path between said pair of signal terminals in the absence of energization of said winding, said conductive path being disrupted upon energization of said control winding;
means, including a coupling between one of said relay signal terminals and said external signal input terminal, and a coupling between the other of said relay signal terminals and said player output terminal, for utilizing said conductive path to complete said second signal path; and
means for causing energization of said control winding in response to said one supply potential development.

5. A video record player comprising:
an external signal input terminal;
a player output terminal;
a player on/off switch, subject to switching between "on" and "off" conditions;
a power supply for developing supply potentials at a plurality of output terminals only when said player on/off switch is in said "on" condition;
means, coupled to one of said power supply output terminals and rendered operative whenever a supply potential is developed thereat, for forming an output signal inclusive of a picture carrier component and a sound carrier component, said output signal forming means having an output terminal;
a normally closed relay having a pair of signal terminals and a control winding, with a low impedance signal path normally provided between said pair of signal terminals but subject to disruption in response to energization of said control winding;
means for coupling said control winding between a power supply output terminal and a point of reference potential;
means for coupling one of said relay signal terminals to said external signal input terminal;
means for coupling the other of said relay signal terminals to said player output terminal;
a first diode connected between said one relay signal terminal and a point of reference potential;
a second diode connected between said output terminal of said output signal forming means and said other relay signal terminal; and
means for forward biasing said first and second diodes in response to supply potential development at one of said power supply output terminals.

6. Apparatus in accordance with claim 5, wherein said means for coupling said one relay signal terminal to said external signal input terminal comprises a first capacitor, and wherein said means for coupling said other relay signal terminal to said player output terminal comprises a second capacitor.

7. Apparatus in accordance with claim 5 wherein said player also includes:
pickup means for recovering recorded picture and accompanying sound information from a video record when selectively enabled during an "on" condition of said on/off switch;
means for forming a composite video signal output in response to an output of said pickup means, said composite video signal output forming means being disabled in the absence of the combined occurrence of an "on" condition for said on/off switch and selective enabling of said pickup means, and
means for forming an audio signal output in response to an output of said pickup means, said audio signal output forming means being disabled in the absence of the combined occurrence of an "on" condition for said on/off switch and selective enabling of said pickup means;
wherein said picture carrrier component of said output signal comprises (a) picture carrier frequency oscillations modulated in amplitude in accordance with said composite video signal output during enabling of said composite video output signal forming means, and (b) effectively unmodulated picture carrier frequency oscillations when disabling of said composite video signal output forming means occurs during an "on" condition for said on/off switch; and
wherein said sound carrier component of said output signal comprises (a) sound carrier frequency oscillations modulated in frequency in accordance with said audio signal output, during enabling of said audio signal output forming means, and (b) unmodulated sound carrier frequency oscillations when disabling of said audio signal output forming means occurs durin an "on" condition for said on/off switch.

8. Apparatus in accordance with claim 7 wherein said output signal forming means includes:
- a first oscillator, subject to operation at a given frequency when said audio signal output forming means is disabled during an "on" condition for said on/off switch, the operating frequency of said first oscillator being subject to deviation from said given frequency in accordance with said audio signal output during enabling of said audio signal output forming means;
- a second oscillator; and an amplitude modulator for modulating the amplitude of an output of said second oscillator (a) in accordance with an output of said first oscillator, when said composite video signal output forming means is disabled during an "on" condition for said on/off switch, and (b) in accordance with a combination of said composite video signal output and said first oscillator output, when said composite video signal output forming means is enabled.

9. Apparatus in accordance with claim 8 wherein the operating frequency of said second oscillator substantially corresponds to a frequency assigned for picture carrier use in television broadcasting, and wherein said given frequency substantially corresponds to the intercarrier difference between picture and accompanying sound carrier frequencies assigned for use in television broadcasting.

10. Apparatus in accordance with claim 8 wherein said amplitude modulator includes:
- a diode bridge, having a pair of input terminals and a pair of output terminals;
- a transformer having respective primary and secondary windings, said secondary winding having a pair of end terminals and a centertap;
- means for connecting each of said pair of bridge input terminals to a respective one of said pair of end terminals;
- means for applying said output of said second oscillator to said primary winding;
- means, coupled to an output terminal of said composite video signal output forming means, and additionally responsive to said first oscillator output, for supplying a modulating signal to said centertap;
- resistance means connected between said pair of end terminals; and
- means for connecting said centertap to an intermediate point of said resistance means.

11. Apparatus in accordance with claim 8 wherein the amplitudes of said first oscillator output and said second oscillator output are so related that the amplitude of said sound component is at least 17 db less than the peak amplitude of said picture carrier component in the output signal formed by said output signal forming means.

12. Video record player apparatus comprising:
- a player RF signal input terminal;
- a player RF signal output terminal;
- a player power supply developing supply potentials when selectively enabled;
- means, rendered operative in response to supply potential development by said power supply, for forming a player output signal inclusive of picture carrier frequency oscillations and sound carrier frequency oscillations;
- means, responsive to supply potential development by said player power supply, for establishing a first signal path between said output signal forming means and said player RF signal output terminal; said first signal path being disrupted in the absence of supply potential development by said player power supply; and
- means, responsive to the absence of supply potential development by said player power supply, for establishing a second signal path between said player RF signal input terminal and said player RF signal output terminal; said second signal path being disrupted in the presence of supply potential development by said player power supply.

13. A system for utilizing the video record player apparatus of claim 12, said system also including:
- a television receiver having an RF signal input terminal;
- an external RF signal source;
- means for coupling said player RF signal output terminal to said television receiver RF signal input terminal; and
- means for coupling the output of said external RF signal source to said player RF signal input terminal;
- whereby said television receiver receives the output of said external RF signal source during player power supply disabling; whereas said television receiver receives said player output signal, to the exclusion of the output of said external RF signal source, during player power supply enabling.

14. Apparatus in accordance with claim 13, wherein said source output coupling means comprises an antenna coupling element, said antenna coupling element being isolated from player RF signal output terminal and said player output signal forming means during player power supply enabling by the disruption of said second signal path.

15. Apparatus in accordance with claim 12:
- wherein said second signal path establishing means includes: a relay having a pair of signal terminals and a control winding, and providing a conductive path between said pair of signal terminals in the absence of energization of said winding, said conductive path being disrupted upon energization of said winding; means for coupling said winding between an output terminal of said player power supply and a point of reference potential; means for coupling one of said realy signal terminals to said player RF signal input terminal; and means for coupling the other of said relay signal terminals to said player RF signal output terminal; and
- wherein said first signal path establishing means includes a diode coupled between an output terminal of said output signal forming means and said other relay signal terminal, and means for forward biasing said diode in response to supply potential development by said player power supply.

16. Apparatus in accordance with claim 15 also including an additional diode coupled between said one relay signal terminal and a point of reference potential, means for forward biasing said additional diode in response to supply potential development by said player power supply; and wherein said means for coupling said one relay signal terminal to said player RF signal input terminal includes a capacitor.

17. Apparatus in accordance with claim 16 wherein the inductance exhibited by said conductive path provided between said pair of relay signal terminals in the absence of power supply enabling, and the capacitances exhibited by said diodes in the absence of forward biasing thereof, form a pi filter having a low pass filter characteristic with a cutoff frequency lying above the highest desired frequency subject to delivery to said player RF signal input terminal.

18. Apparatus in accordance with claim 17, for use with a television antenna coupling element and a television receiver having an RF signal input terminal, said apparatus also including:
   means for coupling said player RF signal output terminal to said television receiver RF signal input terminal; and
   means for coupling said television antenna coupling element to said player RF signal input terminal.

* * * * *